United States Patent [19]

Shiraki et al.

[11] 4,424,456
[45] Jan. 3, 1984

[54] DRIVER CIRCUIT FOR CHARGE COUPLED DEVICE

[75] Inventors: Ryuzo Shiraki; Seizi Watanabe, both of Tokyo; Toshio Yuyama, Kawasaki, all of Japan

[73] Assignee: Tokyo Shibaura Denki Kabushiki Kaisha, Kawasaki, Japan

[21] Appl. No.: 219,239

[22] Filed: Dec. 23, 1980

[30] Foreign Application Priority Data

Dec. 26, 1979 [JP] Japan ............................ 54-169731
Dec. 26, 1979 [JP] Japan ............................ 54-169732
Dec. 26, 1979 [JP] Japan ............................ 54-169733
Dec. 26, 1979 [JP] Japan ............................ 54-169734
Dec. 26, 1979 [JP] Japan ............................ 54-169735
Dec. 26, 1979 [JP] Japan ............................ 54-169737

[51] Int. Cl.³ ..................... H03K 5/01; H03K 17/687
[52] U.S. Cl. ..................... 307/268; 307/246; 307/451; 307/475; 377/60
[58] Field of Search ............... 307/444, 451, 469, 475, 307/221 D, 496, 246, 585, 263, 264, 268, 304, 270; 77/57, 58, 60, 63

[56] References Cited

U.S. PATENT DOCUMENTS

| T952,012 | 11/1976 | Lee | 307/451 |
|---|---|---|---|
| 3,449,594 | 6/1969 | Gibson et al. | 307/585 |
| 3,457,435 | 7/1969 | Burns et al. | 307/246 X |
| 3,522,454 | 8/1970 | Gilmour | 307/246 X |
| 3,603,816 | 9/1971 | Podraza | 307/246 X |
| 3,631,528 | 12/1971 | Green | 307/585 X |
| 3,765,002 | 10/1973 | Basse | 307/246 X |
| 3,794,862 | 2/1974 | Jenne | 307/304 |
| 3,906,254 | 9/1975 | Lane et al. | 307/475 |
| 3,932,773 | 1/1976 | Lüscher et al. | 307/246 X |
| 3,959,782 | 5/1976 | Dunn | 307/246 X |
| 4,002,927 | 1/1977 | Nakamura et al. | 307/268 X |
| 4,032,795 | 6/1977 | Hale | 307/264 X |
| 4,082,963 | 4/1978 | Hoffmann | 307/221 D |
| 4,216,393 | 8/1980 | Gillberg et al. | 307/263 X |
| 4,246,496 | 1/1981 | Heller | 307/221 D |
| 4,344,001 | 8/1982 | Tsuchiya et al. | 307/221 D |

Primary Examiner—Stanley D. Miller
Assistant Examiner—David R. Hudspeth
Attorney, Agent, or Firm—Finnegan, Henderson, Farabow, Garrett & Dunner

[57] ABSTRACT

A driver circuit for a charge coupled device which includes a CMOS inverter including a P channel MOS transistor and an N channel MOS transistor for inverting the level of an input control pulse, an output terminal of the CMOS inverter being connected to a charge coupled device such that the P channel MOS transistor functions to charge the equivalent load capacitance of the charge coupled device and the N channel MOS transistor functions to discharge the equivalent load capacitance. A continuously variable DC power supply is provided for applying a variable gate voltage to the gate of at least one of the P and N channel MOS transistors to change the mutual conductance of the transistor so that the time constant of the charge or discharge circuit to the load capacitance can be adjusted to optimize the charge transfer efficiency of the charged coupled device.

14 Claims, 33 Drawing Figures

FIG. 11
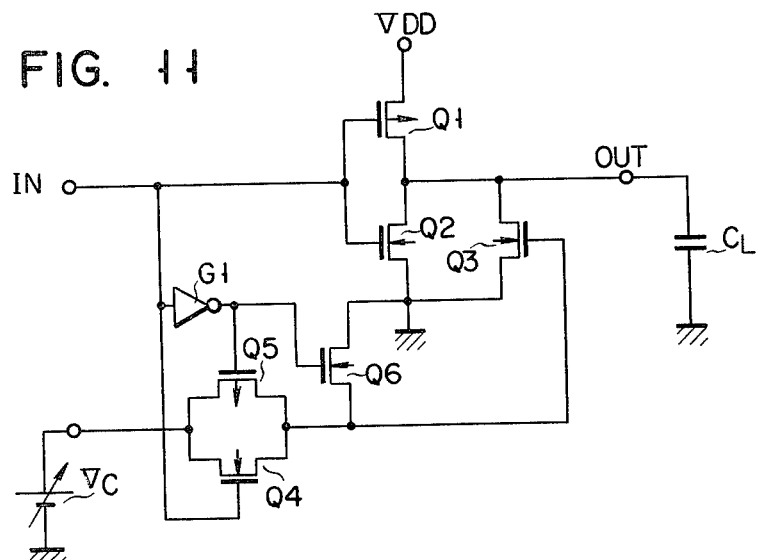
FIG. 12
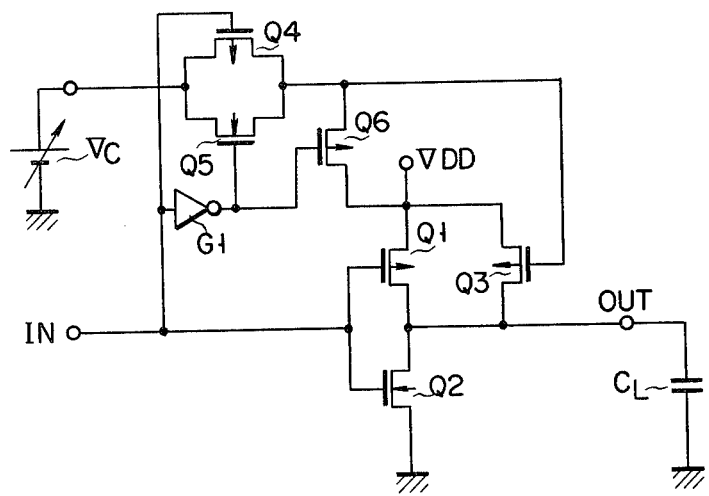
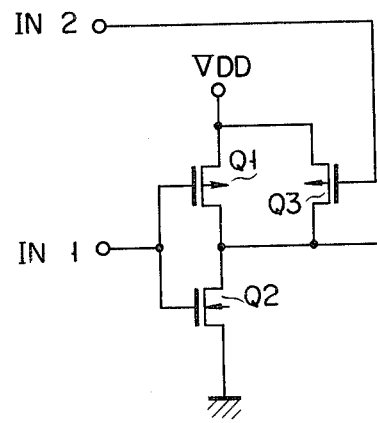
FIG. 13

FIG. 14A IN1
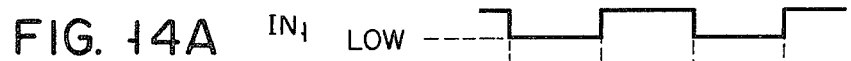
FIG. 14B IN2
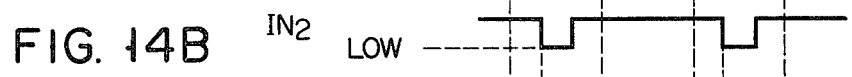
FIG. 14C OUT
FIG. 15
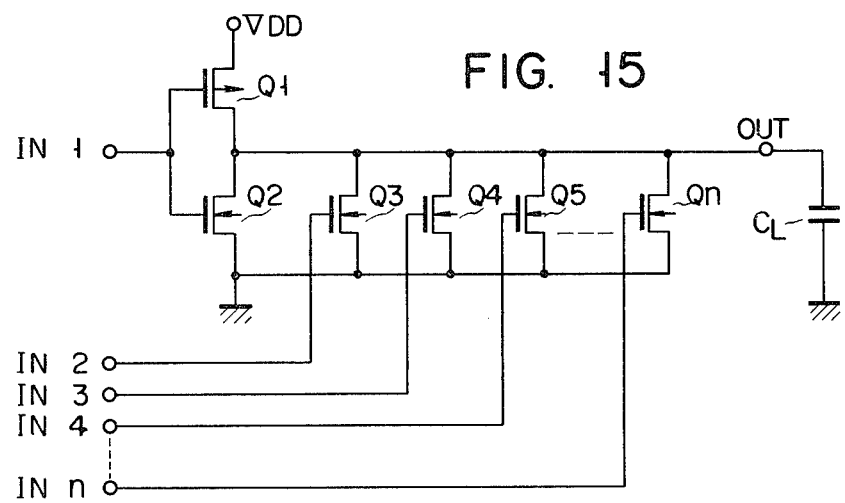
FIG. 16
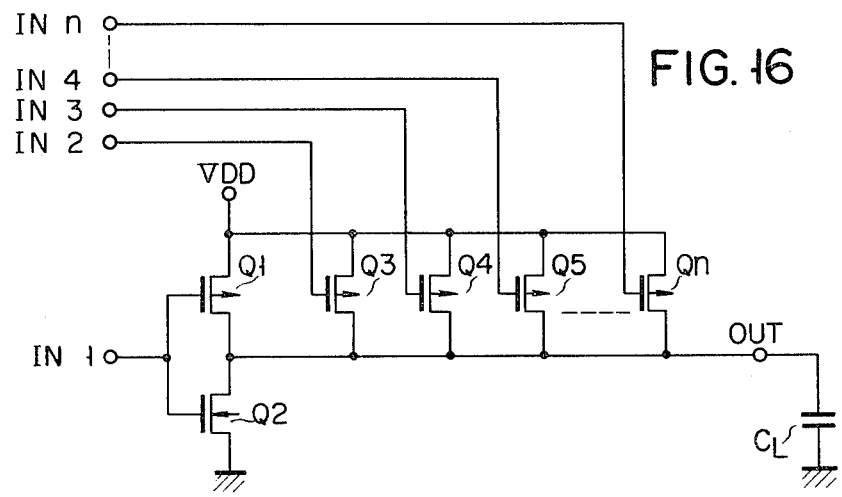

DRIVER CIRCUIT FOR CHARGE COUPLED DEVICE

The present invention relates to a driver circuit for a charge coupled device.

BACKGROUND OF THE INVENTION

Charge coupled devices (to be referred to as "CCD" for brevity hereinafter) have recently been applied to various devices. The fields of application may be roughly divided into solid state image pick-up devices, memory devices, analog signal processing devices and so on. When applied to such fields, CCDs require that a transfer pulse be inputted for transferring the signal charge. The transfer efficiency of the signal charge of the CCD largely depends on the waveform of the transfer pulse. In order to improve the transfer efficiency, it is, therefore, necessary to obtain a transfer pulse which has a waveform matched with the proper characteristics of the CCD, that is, the waveform required for the proper characteristics of the CCD.

Further, the capacitance value of the CCD ranges widely depending on the size of the CCD. For example, when considering a case wherein the CCD is applied to a two-dimensional sensor, the capacitance value is 100 to 200 pF with a sensor of 40 (vertical)×14 (horizontal) picture elements, 300 to 500 pF with a sensor of 200 (vertical)×100 (horizontal) picture elements, and is 1,500 to 5,000 pF with a sensor of 512 (vertical)×340 (horizontal) picture elements. The capacitance value of the CCD thus varies depending on its size. Even with CCDs manufactured by the same manufacturing process, there is some variation in the capacitance value of the respective CCDs. The variation of the power source voltage during the operation of the CCD, the variation of the ambient temperature and so on must also be taken into consideration. When these variations are considered, it is difficult to transfer the signal charge with high efficiency without any compensation means.

The pesent invention has been made in consideration of this and has for its object ot provide a driver circuit for a charge coupled device which is capable of outputting a transfer pulse of a waveform matched with the proper characteristics of the CCD, that is, the waveform required by the CCD.

SUMMARY OF THE INVENTION

According to the present invention, there is provided a driver circuit comprising a CMOS inverter including two complementary MOS transistors for inverting the level of an input pulse signal, the output terminal of said CMOS inverter adapted to be connected to a charge coupled device;
 charge circuit means including one of the MOS transistors for supplying current to charge the equivalent load capacitance of said charge coupled device;
 discharge circuit means including one of the MOS transistors for discharging the load capacitance of said charge coupled device; and
 control means for enabling continuous variance the time constant of at least one of said charge circuit means and said discharge circuit means.

The basic principle of the present invention will now be described.

FIG. 1 shows the basic construction of a driver circuit for driving a CCD. The driver circuit of FIG. 1 comprises a CMOS (complementary metal oxide semiconductor) inverter. A CCD of equivalent circuit $C_L$ is connected to the output side of the inverter. Transistors Q1 and Q2 constituting the inverter are a p-type channel MOS transistor and an n-type channel MOS transistor, respectively.

With the driver circuit shown in FIG. 1, the rise time of the output pulse (transfer pulse), that is, the rising characteristic of the waveform at the rising edge, may be determined by a time constant $RQ1 \cdot C_L$ which may be represented by the product of the resistance value RQ1 of the transistor Q1 when it is on and the capacitance of the equivalent capacitor $C_L$ (which may be represented as a load capacitor). Further, the fall time of the transfer pulse, that is, the falling characteristic of the waveform at the falling edge, may be determined by a time constant $RQ2 \cdot C_L$ which may be represented by the product of the resistance value RQ2 of the transistor Q2 when it is on and the capacitance of the equivalent capacitor $C_L$.

Accordingly, the rise time and the fall time of the transfer pulse may be controlled by varying the time constant during the charging and/or discharging period. The present invention has been made based on this principle and provides a pulse obtained by controlling the waveform of the output transformer pulse by varying the time constant during the charging and/or discharging period so that the pulse is matched with the proper characteristic of the CCD, that is, the pulse is capable of transferring the signal charge with high efficiency.

FIG. 2 is a circuit diagram illustrating the principle of the driver circuit of the present invention based on this finding. In the circuit shown in FIG. 2, a resistor RQ1 represents the resistance in the charge path when the transistor Q1 (FIG. 1) is on, and a resistor RQ2 represents the resistance in the discharge path when the transistor Q2 (FIG. 1) is on. The resistances RQ1 and RQ2 are represented as variable by external voltages. For varying the resistances RQ1 and RQ2, the mutual conductance gm of the MOS transistors included in the charge path and/or the discharge path is varied.

The mutual conductance gm of the MOS transistor is given by the following equation:

$$gm = (W/L) \cdot \epsilon_{ox}/t_{ox} \cdot \mu \cdot (V_{gs} - V_{th}) \quad (1)$$

where
 W: channel width,
 L: channel length,
 $\epsilon_{ox}$: dielectric constant of an SiO$_2$ film,
 $t_{ox}$: thickness of an SiO$_2$ film,
 $\mu$: mobility of MOSFET,
 Vgs: gate-to-source voltage, and,
 Vth: threshold voltage of MOS transistor.
The values of W/L, Vgs, and Vth may be considered as parameters for varying the mutual conductance gm of equation (1).

BRIEF DESCRIPTION OF THE DRAWINGS

This invention can be more fully understood from the following detailed description when taken in conjunction with the accompanying drawings, in which:

FIGS. 11 to 31 are views illustrating further embodiments of the present invention.

DESCRIPTION OF THE PREFERRED EMBODIMENTS

Figure 1:
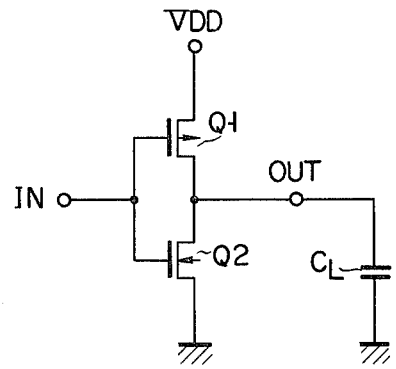
FIG. 1 is a view illustrating a MOSFET inverter as applied to a CCD.
Figure 2:
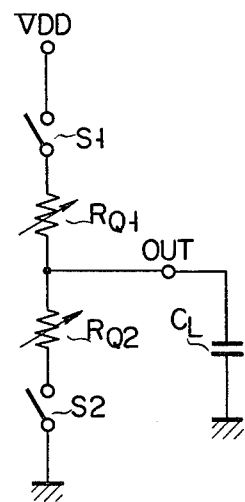
FIG. 2 is a circuit diagram illustrating the principle of the present invention.
Figure 3:
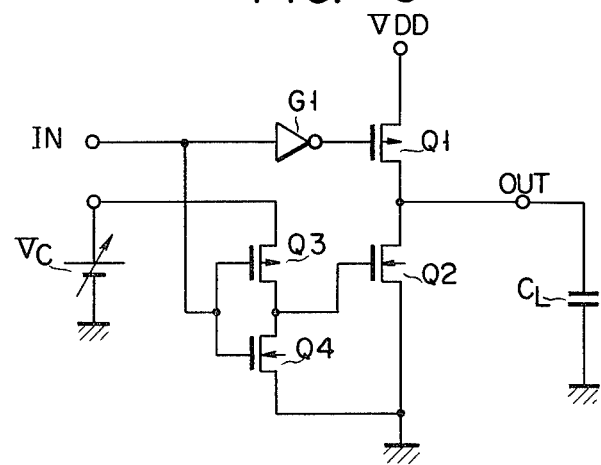
FIG. 3 is a circuit diagram of one embodiment of the driver circuit for a charge coupled device according to the present invention.

FIG. 3 shows a driver circuit of the present invention. In this embodiment, the fall time of the output pulse is controlled by varying the gate voltage.

In all of the embodiments of the present invention, including this embodiment, the circuit is shown as connected to the CCD of the equivalent capacitor (load capacitor) $C_L$.

Accordingly, in the description of the further embodiments, this will not be particularly mentioned, but will be omitted.

In the embodiment shown in FIG. 3, a p-type channel MOS transistor Q3 and an n-type channel MOS transistor Q4 constitute a CMOS inverter. The drains of the transistors Q3 and Q4 are commonly connected, and are connected to the gate of the n-type channel MOS transistor Q2. The gates of the transistors Q3 and Q4 are commonly connected and are connected to the input terminal IN of the driver circuit. A control voltage Vc is applied to the source of the transistor Q3. The source of the transistor Q4 is grounded. The drain of the transistor Q2 is connected to the drain of the p-type channel transistor Q1, and both drains are connected to the output terminal OUT of the driver circuit. A voltage VDD is applied to the source of the transistor Q1. The source of the transistor Q2 is grounded. The gate of the transistor Q1 is connected to the input terminal IN through an inverter G1.

The mode of operation of the embodiment shown in FIG. 3 will now be described.

Considering a case wherein the input pulse signal is at high level, the transistor Q1 is on. The transistor Q3 is off, the transistor Q4 is on, and the transistor Q2 is off. Accordingly, the charge current flows to the load capacitor $C_L$ through the transistor Q1 with a time constant of $RQ1 \cdot C_L$. RQ1 represents the resistance value of the transistor Q1.

When the input pulse signal is at low level, the transistor Q1 is off, the transistor Q3 is on and the transistor Q4 is off. A control voltage Vc is applied to the gate of the transistor Q2 through the transistor Q3. When the voltage Vc is set to be more than the threshold voltage of the transistor Q2, the transistor Q2 is on and the discharge current flows through the transistor Q2 with a time constant $RQ2 \cdot C_L$. RQ2 is the resistance value of the transistor Q2 when it is on. When the control voltage Vc is varied, the gate-source voltage of the transistor Q2 varies so that the mutual conductance gm of the transistor Q2 also changes. That is, the resistance value RQ2 of the transistor Q2 changes. As may be apparent from the description concerning the case when the input signal is at low level, the time constant during the discharge time may be varied by varying the control signal Vc when the input level is at low level, so that the discharge current may be controlled. Thus, the waveform of the negative-going edge of the output pulse, that is, the transfer pulse, may be controlled through Vc.

Figure 4:
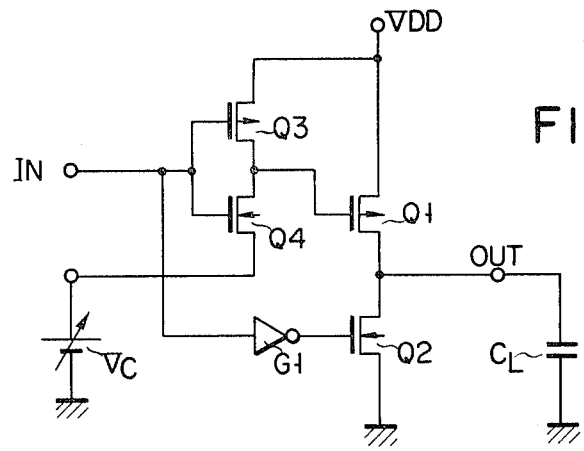
FIGS. 4 to 8 are views illustrating other embodiments of the present invention.

FIG. 4 shows another embodiment of the present invention. The circuit of this embodiment is a circuit for controlling the rise time of the transfer pulse, that is, the waveform at the positive-going edge. The description of the same parts as those in the embodiment shown in FIG. 3 will be omitted.

In this embodiment, the transistors Q3 and Q4 constitute an inverter. The gates of the transistor Q3 and Q4 are connected to the input terminal IN. The drains of the transistors Q3 and Q4 are connected to the gate of the transistor Q1. A control voltage Vc is applied to the source of the transistor Q4. The gate of the transistor Q2 is connected to the input terminal IN through an inverter G1.

The mode of operation of the driver circuit of the above construction will now be described.

Considering a case wherein the input pulse signal is at high level, the transistor Q3 is off, and the transistor Q4 is on. The transistor Q2 is off. Thus, in this case, the charge current flows through the transistor Q1 with a time constant $RQ1 \cdot C_L$. Thus, the control voltage Vc is applied to the gate of the transistor Q1 through the transistor Q4. Therefore, the gate-source voltage of the transistor Q1 may be varied by controlling the control voltage Vc, so that the mutual conductance gm of the transistor Q1 may be varied. For substantially the same reason as described with reference to the embodiment shown in FIG. 3, the waveform at the rising edge of the output pulse, that is, the transfer pulse, may be determined to a desired one.

Considering a case wherein the input pulse signal is at low level, the transistor Q3 is on, the transistor Q4 is off, and the transistor Q1 is off. The transistor Q2 is on. The charge on the load capacitor $C_L$ is discharged through the transistor Q2.

According to the embodiments shown in FIGS. 3 and 4, by varying by the external control signal the gate voltage of the transistor included in the charge path or the discharge path by means of the external control signal, the rising characteristics and the falling characteristics of the output pulse may be controlled, and a transfer pulse of a required waveform may be outputted to the CCD connected to the driver circuit of the present invention, thereby improving the transfer efficiency of the CCD.

Although the fall time was controlled in the embodiment shown in FIG. 3 and the rise time was controlled in the embodiment shown in FIG. 4, it is to be understood that both the rise time and the fall time may be controlled with a construction combining the circuits shown in FIGS. 3 and 4.

Figure 5:
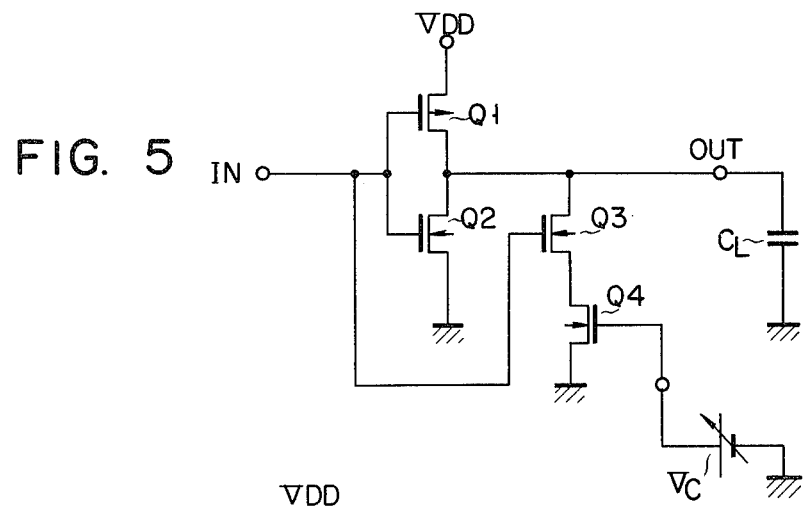

FIG. 5 shows still another embodiment of the present invention.

FIG. 5 shows a circuit for controlling the fall time.

The p-type channel MOS transistor Q1 and the n-type channel MOS transistor Q2 constitute a CMOS inverter. The gates of the transistors Q1 and Q2 are connected to the input terminal IN. A voltage VDD is applied to the source of the transistor Q1. The source of the transistor Q2 is grounded. The drains of the transistors Q1 and Q2 are connected to the output terminal OUT of the driver circuit. The n-type channel MOS transistor Q3 and the n-type channel MOS transistor Q4 are series-connected. The drain of the transistor Q3 is connected to the output terminal OUT, and its source is connected to the drain of the transistor Q4. The source of the transistor Q4 is grounded. The gate of the transistor Q3 is connected to the input terminal IN. A voltage Vc is applied to the gate of the transistor Q4.

The mode of operation of the embodiment shown in FIG. 5 will be described.

Considering a case wherein the input pulse voltage is at low level, the transistor Q1 is on and the transistors Q2 and Q3 are off. Accordingly, the charge current flows to the load capacitor $C_L$ through the transistor Q1 with a time constant $RQ1 \cdot C_L$. RQ1 is the resistance value of the transistor Q1 when it is on.

When the input pulse signal is at high level, the transistor Q1 is off and the transistors Q2 and Q3 are on. By setting the control voltage Vc higher than the threshold voltage of the transistor Q4, the discharge current flows from the load capacitor $C_L$ through the transistors Q2, Q3, and Q4. Thus, the mutual conductance gm of the transistor Q4 may be varied by varying the control voltage. By varying the control voltage Vc when the input pulse signal is at high level, that is, the fall time, the waveform at the falling edge, or the falling characteristics may be controlled. Accordingly, a pulse of a desired waveform required by the CCD of the equivalent circuit $C_L$ is outputted.

Figure 6:
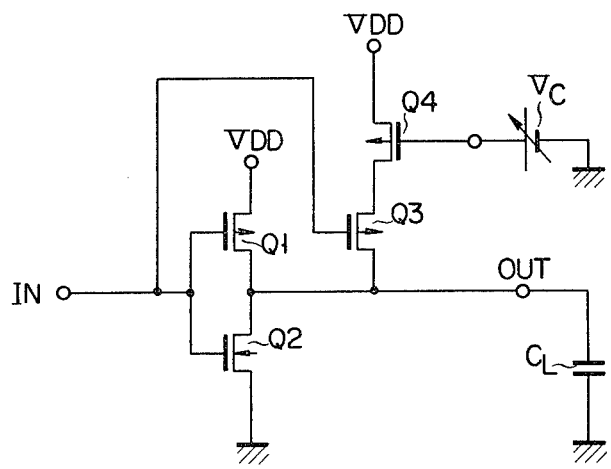

FIG. 6 shows still another embodiment of the present invention. This embodiment employs basically the same principle as the embodiment shown in FIG. 5, but is different from it in that the rising characteristics are controlled. Therefore, the description for the parts which correspond to those of the embodiment shown in FIG. 5 will be omitted.

The MOS transistor Q3 is of p-type channel; its drain is connected to the output terminal OUT and its drain is connected to the drain of the p-type channel MOS transistor Q4. A voltage VDD is applied to the source of the transistor Q4. A control voltage Vc is applied to the gate of the transistor Q4.

Describing the mode of operation of this embodiment with reference to a case wherein the input pulse signal is at low level, the transistor Q1 is on, the transistor Q2 is off, and the transistor Q3 is on. Thus, the charge current flows to the load capacitor $C_L$ through the transistor Q1. When the control voltage Vc is varied in this case, the gate-source voltage of the transistor Q4 varies and the mutual conductance gm of the transistor Q4 varies. By varying the control voltage Vc when the input pulse signal is at low level, the mutual conductance gm of the transistor Q4 may be varied and the wave form at the rising edge may be controlled. The transfer pulse of a waveform required by the CCD may be obtained.

Considering a case wherein the input pulse signal is at high level, the transistors Q1 and Q3 are off, and the transistor Q2 is on. The electrons charged in the load capacitor $C_L$ are discharged through the transistor Q2.

According to the embodiments shown in FIGS. 5 and 6, since the charge path and the discharge path are divided into a plurality of paths so that the power consumed by an individual transistor becomes small, heat does not become concentrated, and the breakdown of the device is prevented.

Although the fall time was controlled in the embodiment shown in FIG. 5 and the rise time was controlled in the embodiment shown in FIG. 6, it is to be understood that both the rise time and the fall time may be controlled with a construction combining the circuits shown in FIGS. 5 and 6.

Figure 7:
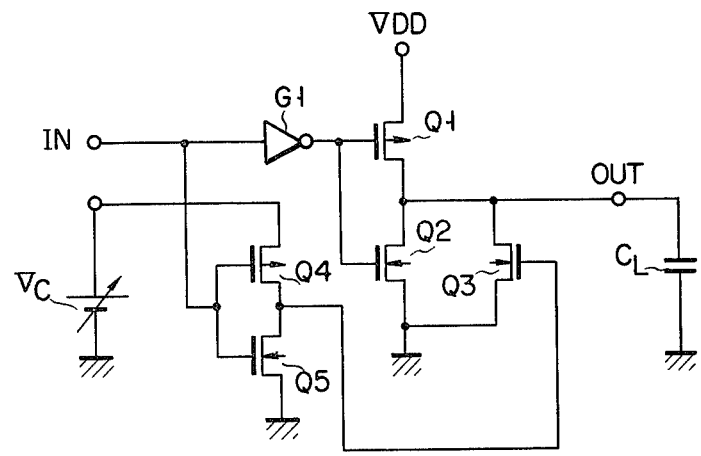

FIG. 7 shows still another embodiment of the present invention. In the circuit shown in FIG. 7, the fall time is controlled.

In the embodiment shown in FIG. 7, the p-type channel MOS transistor Q4 and the n-type channel MOS transistor Q5 constitute a CMOS inverter. The gates of the transistors Q4 and Q5 are connected to the input terminal IN. A positive voltage Vc is applied to the source of the transistor Q4. The source of the transistor Q5 is grounded. The p-type channel MOS transistor Q1 and the n-type channel MOS transistor Q2 constitute a CMOS inverter. A voltage VDD is applied to the source of the transistor Q1. The source of the transistor Q2 is grounded. The gates of the transistors Q1 and Q2 are connected to the input terminal IN through an inverter G1. The n-type channel MOS transistor Q3 is connected in parallel with the transistor Q2. The drain of the transistor Q2 is connected to the drain of the transistor Q3, and the source of the transistor Q2 is connected to the source of the transistor Q3.

Describing the mode of operation of the circuit of this construction with reference to a case wherein the input pulse signal is at high level, the transistor Q1 is on, the transistor Q2 is off, the transistor Q4 is off and the transistor Q5 is on. Thus, the transistor Q3 is off. The charge current flows to the load capacitor $C_L$ through the transistor Q1.

When the input pulse signal is at low level, the transistor Q1 is off, the tranisitor Q2 is on, the transistor Q4 is on and the transistor Q5 is off. A control voltage Vc is applied to the gate of the transistor Q3 through the transistor Q4. Thus, the discharge current flows from the load capacitor $C_L$ through the transistors Q2 and Q3. The fall time may be controlled by varying the control voltage Vc, and a pulse of a desired waveform required by the CCD may be outputted.

Figure 8:
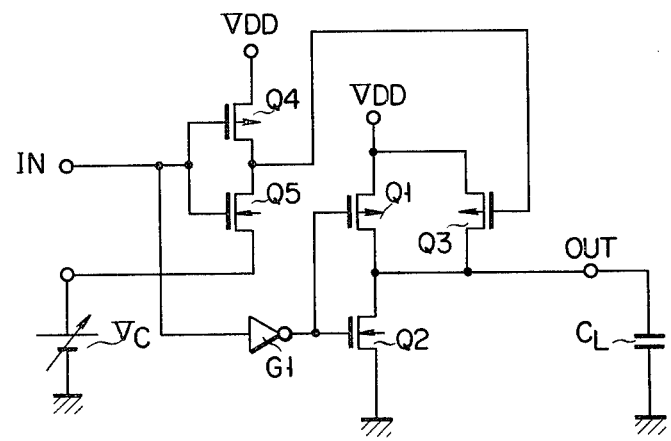

FIG. 8 shows still another embodiment of the present invention. Since this embodiment is basically the same as that shown in FIG. 7, only the part which is different will be described.

The transistor Q3 is of p-type channel. A control voltage Vc is applied to the source of the transistor Q5. The source of the transistor Q4 is connected to a voltage VDD. The drains of the transistors Q4 and Q5 are connected to the gate of the p-type channel MOS transistor Q3. A voltage VDD is applied to the source of the transistor Q3. The drain of the transistor Q3 is connected to the output terminal OUT.

The mode of operation of the circuit of this construction will now be described.

In a case wherein the input pulse signal is at high level, the transistors Q1 and Q5 are on and the transistors Q2 and Q4 are off. A control voltage Vc is applied to the gate of the transistor Q3 through the transistor Q5. The charge current flows to the load capacitor $C_L$ through the transistors Q1 and Q3. The mutual conductance gm of the transistor Q3 may be varied by varying the control voltage Vc. That is, the charge current flowing through the transistor Q3 may be controlled by controlling the control voltage Vc. The rise time of the transfer pulse may thus be controlled.

When the input pulse signal is at low level, the transistor Q1 is off, the transistor Q2 is on, the transistor Q4 is on, the transistor Q5 is off, and the transistor Q3 is off. Thus, the electrons charged in the load capacitor $C_L$ are discharged through the transistor Q2.

As may be apparent from the above description, in the embodiments shown in FIGS. 7 and 8, since the charge current path and the discharge current path are divided into a plurality of paths, the power consumed per transistor may be decreased and a concentration of generated heat may be prevented. Further, since only one transistor, the transistor Q3, is required for controlling the charge current or the discharge current, the chip size for an IC may be made smaller.

Figure 9:
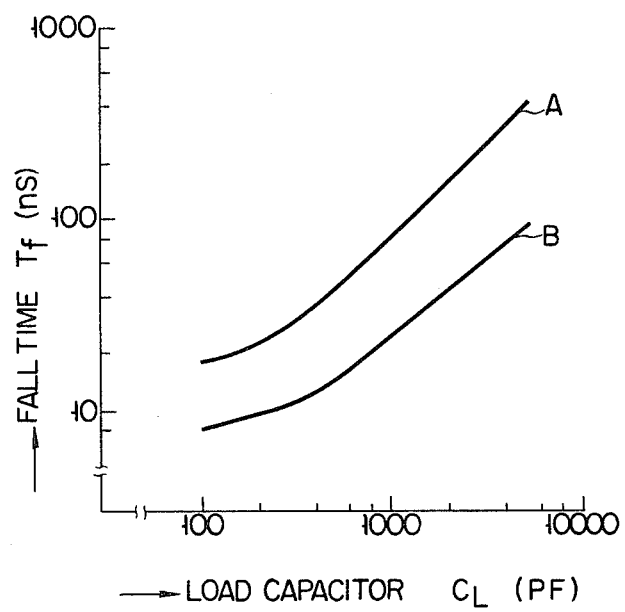
FIG. 9 is a characterstic curve of the fall time Tf as a function of the capacitance of the load capacitor $C_L$.

FIG. 9 shows the variation of the fall time Tf as a function of the capacitance of the load capacitor $C_L$.

The characteristic curve A is obtained with the embodiment shown in FIG. 7 when the transistor Q3 is off. In this case, since the discharge current flows not through the transistor Q3 but through the transistor Q2, the fall time Tf is determined by the time constant defined by the resistance of the transistor Q2 when it is on and the capacitance of the load capacitor $C_L$. The characteristic curve B is obtained when the control voltage Vc is sufficiently high and the transistor Q3 is on. In this case, the discharge current flows through the transistors Q2 and Q3. Due to this, the fall time Tf is determined by the time constant defined by the capacitance of the load capacitor and the combined resistance of the transistor Q2 when it is on and the transistor Q3 when it is on. The characteristic curve B also shows the case wherein the time constant in the discharge path is at the minimum.

Figure 10:
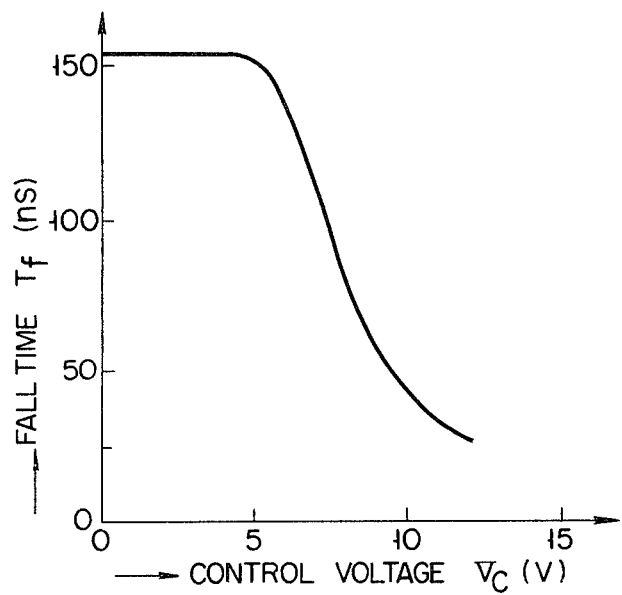
FIG. 10 is a characteristic curve of the fall time Tf as a function of the control voltage Vc.

FIG. 10 shows the variation of the fall time as a function of the control voltage Vc.

The following may be understood from the characteristic curve shown in FIG. 10. When the control voltage is low, the fall time Tf is great and corresponds to the characteristic curve A shown in FIG. 9. When the control voltage is high, the fall time Tf becomes small and corresponds to the characteristic curve B shown in FIG. 9.

FIG. 11 shows still another embodiment of the present invention. In the circuit of this embodiment, the fall time is controlled.

The p-type channel MOS transistor Q1 and the n-type channel MOS transistor Q2 constitute a CMOS inverter. A voltage VDD is applied to the source of the transistor Q1. The gates of the transistors Q1 and Q2 are connected to the input terminal IN. The source of the transistor Q2 is grounded. The drains of the transistors Q1 and Q2 are connected to the output terminal OUT. The n-type channel MOS transistor Q4, the p-type channel MOS transistor Q5, and the inverter G1 constitute an analog switch. A control voltage Vc is applied to the drain of the transistor Q4 and to the source of the transistor Q5. The source of the transistor Q4 and the drain of the transistor Q5 are connected to the gate of the n-type channel MOS transistor Q3. The source of the transistor Q3 is grounded and its drain is connected to the output terminal OUT. The drain of an n-type channel MOS transistor Q6 is connected to the source of the transistor Q4 and to the drain of the transistor Q5. The source of the transistor Q6 is grounded. The gates of the transistors Q5 and Q6 are connected to the input terminal IN through the inverter G1. The gate of the transistor Q4 is connected to the input terminal IN.

The mode of operation of the circuit of this construction will now be described.

When the input voltage signal is at low level, the transistor Q1 is on, the transistor Q2 is off, and the analog switch consisting of the transistors Q4 and Q5 and the inverter G1 is off. The transistor Q6 is on and the transistor Q3 is off. Thus, the charge current flows to the load capacitor $C_L$ through the transistor Q1. The transistor Q6 is a circuit for assuring, when the analog switch is off, that a voltage is applied to the gate of the transistor Q3 and the transistor Q3 is not kept at a high impedance.

When the input pulse signal is at high level, the transistor Q1 is off, the transistor Q2 is on, and the analog switch consisting of the transistors Q4 and Q5 and the inverter G1 is on. A control voltage Vc is applied to the gate of the transistor Q3. Thus, the discharge current flows from the load capacitor $C_L$ through the transistors Q2 and Q3. By varying the control voltage Vc, the gate-source voltage of the transistor Q3 varies through the analog switch so that the mutual conductance gm of the transistor Q3 varies. Thus, the discharge current flowing through the transistor Q3 varies. The fall time of the transfer pulse is thus controlled.

FIG. 12 shows still another embodiment of the present invention. Although the rise time of the transfer pulse is controlled in this embodiment, this embodiment is substantially the same as the embodiment shown in FIG. 11. Therefore, description of the same parts will be omitted.

In this embodiment, the transistors Q3 and Q6 are of p-type channel. The transistor Q3 is connected in parallel with the transistor Q1.

The mode of operation of this embodiment will now be described.

When the input pulse signal is at high level, the transistor Q1 is on, the transistor Q2 is off, and the analog switch consisting of the transistors Q4 and Q5 and the inverter G1 is on. The transistor Q6 is off. A control voltage Vc is inputted to the gate of the transistor Q3. The charge current thus flows to the load capacitor $C_L$ through the transistors Q1 and Q3.

When the input pulse signal is at high level, the transistor Q1 is off, the transistor Q2 is on, and the analog switch consisting of the transistors Q4 and Q5 and the inverter G1 is off. The transistor Q6 is on. Then, a control voltage Vc is applied to the gate of the transistor Q3 and the transistor Q3 is off. The electrons charged on the load capacitor $C_L$ are discharged through the transistor Q2. By varying the control voltage Vc, the gate-source voltage of the transistor Q3 may be varied through the analog switch, so that the mutual conductance gm of the transistor Q3 may be varied. Since the charge current flowing through the transistor Q3 may be controlled, the waveform of the output pulse, that is, the transfer pulse, may be determined to be the one required by the CCD.

In the embodiments shown in FIGS. 11 and 12, since the control voltage Vc is applied to the gate of the transistor Q3 through the analog switch, the range of change of the control voltage Vc may be set to be great.

Although the fall time was controlled in the embodiment shown in FIG. 11 and the rise time was controlled in the embodiment shown in FIG. 12, it is to be understood that both the fall time and the rise time may be controlled with a construction combining the circuits of these embodiments.

FIG. 13 shows still another embodiment of the present invention. In this embodiment, the time constant is varied in two steps during the charge, and the rise time is controlled in this manner.

In FIG. 13, the p-type channel MOS transistor Q1 and the n-type channel MOS transistor Q2 constitute a CMOS inverter. The gates of the transistors Q1 and Q2 are connected to a first input terminal IN1, and the drains of the transistors Q1 and Q2 are connected to the output terminal OUT. The p-type channel MOS transistor Q3 is connected in parallel with the transistor Q1. The gate of the transistor Q3 is connected to a second input terminal IN2.

Describing the mode of operation referring to FIGS. 14A to 14C, when a first input signal (FIG. 14A) is at low level and a second input signal (FIG. 14B) is at high level, the transistor Q1 alone is on. The charge current (FIG. 14C) flows through the transistor Q1 with a time constant determined by the resistance value of the transistor Q1 when it is on and the capacitance of the load capacitor $C_L$.

When the first input signal and the second input signal are both at low level, both the transistors Q1 and Q3 are on. The charge current thus flows with a time constant determined by the sum of the capacitance value of the load capacitor $C_L$ and the resistance values of the transistors Q1 and Q3 when they are on. By setting the time constant when the transistors Q1 and Q3 are on to be smaller than the time constant when the transistor Q1 alone is on, the rising characteristic when the transistors Q1 and Q3 are both on may be controlled to be steep. The rise time may be controlled in this manner.

When the first input signal and the second input signal are both at high level, the transistor Q2 is on and the transistors Q1 and Q3 are off. The charge stored on the load capacitor $C_L$ is discharged through the transistor Q2.

In the embodiment shown in FIG. 13 by varying the time constant in two steps during the charging period, the charging characteristics may be selected and a desired pulse may be obtained.

In the embodiment shown in FIG. 13 the transistor Q3 connected in parallel with the transistor of the inverter is not limited to one in manner, but a plurality of transistors may be connected in parallel which may then be controlled with a time constant which changes in more than two steps.

FIG. 15 shows still another embodiment of the present invention. The fall time is controlled in this embodiment, and a plurality of MOS transistors are connected in parallel with one of the transistors of the inverter.

The p-type channel MOS transistor Q1 and the n-type channel MOS transistor Q2 constitute a CMOS inverter. The gates of the transistors Q1 and Q2 are connected to the input terminal IN. The drains of the transistors Q1 and Q2 are connected to the output terminal OUT. N-type channel MOS transistors Q3, Q4, ... Qn are connected in parallel with the transistor Q2. The gates of the transistors Q3, Q4, ... Qn are connected to input terminals IN2, IN3, ... and INn, respectively.

The mode of operation of the driver circuit of this construction will be described.

When first, second, third, ... input pulse signals inputted to the first, second, third, ... input terminals IN1, IN2, IN3, ..., respectively, are all at low level, the transistor Q1 is on, and the transistors Q2, Q3, Q4, ... Qn are off so that the charge current flows to the capacitor $C_L$.

When the first input signal is at high level and the second, third, ... input signals are at low level, the transistor Q2 is on and the transistors Q1, Q3, Q4, ... Qn are off. Then, the discharge current flows through the transistor Q2 with a time constant determined by the resistance value of the transistor Q2 when it is on and the capacitance of the capacitor $C_L$.

When the first, second, ... input signals are all at high level, the transistor Q1 is off, and the transistors Q2, Q3, ... Qn are on. In this case, the discharge current flows with a time constant determined by the combined resistance value of the resistance of the transistors Q2, Q3, ... Qn when they are on, and the capacitance of the load capacitor $C_L$.

By setting the time constant when the transistors Q2, Q3, ... Qn are on to be smaller than the time constant when the transistor Q2 alone is on, and by controlling the timing of level change of the input signals, the falling characteristics when the transistors Q2, Q3, ... Qn are on may be made steep. The fall time of the pulse may be controlled in this manner. The levels of the input signals need not change simultanuously. The levels may change at different times according to the waveshape as desired.

FIG. 16 shows still another embodiment of the present invention.

This embodiment is substantially the same as that shown in FIG. 13, except that the rise time is controlled in this embodiment.

In this embodiment, p-type channel MOS transistors Q3, Q4, ... Qn are connected in parallel with the transistor Q1. The transistors Q3, Q4, ... Qn are connected to the input terminals IN2, IN3, ... INn, respectively.

The mode of operation of this embodiment is substantially the same as that shown in FIG. 13, so a detailed description will be omitted. In the case of this embodiment, the rise time is controlled by selectively controlling the operation of the transistors Q3, Q4, ... Qn.

It is also possible to control both the fall time and the rise time with a construction combining the embodiment shown in FIG. 15 and the embodiment shown in FIG. 16.

Figure 17:
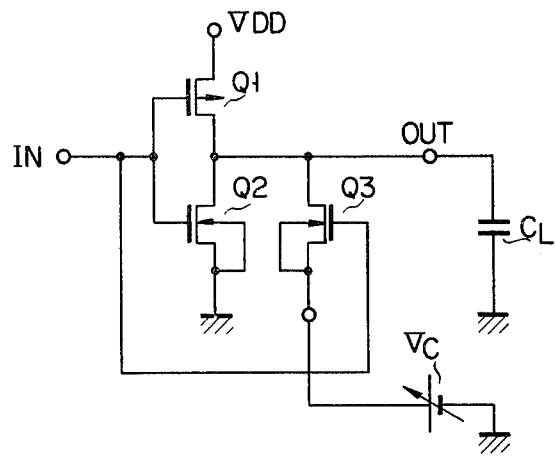

FIG. 17 shows a still further embodiment of the present invention. In this embodiment, a control voltage Vc is applied to the source of the MOS transistor in the discharge path to vary the mutual conductance gm of this MOS transistor.

In FIG. 17, the transistors Q1 and Q2 constitute a CMOS inverter. A voltage VDD is applied to the source of the p-type channel MOS transistor Q1. The source of the n-type channel MOS transistor Q2 is grounded. The gates of the transistors Q1 and Q2 are connected to the input terminals IN. The drains of the transistors Q1 and Q2 are connected to the output terminal OUT. The source and substrate of the transistor Q2 is connected to the ground. The drain of the n-type channel MOS transistor Q3 is connected to the drains of the transistors Q1 and Q2. A control voltage Vc is applied to the source of the transistor Q3. The source of the transistor Q3 is connected to the substrate. The gate of the transistor Q3 is connected to the input terminal IN.

The mode of operation of this embodiment will now be described.

When the input pulse signal is at low level, the transistor Q1 is on, and the transistors Q2 and Q3 are off. Thus, the charge current flows to the load capacitor $C_L$ through the transistor Q1.

When the input pulse signal is at high level, the transistor Q1 is off, and the transistors Q2 and Q3 are on. Thus, the discharge current flows from the load capacitor $C_L$ through the transistors Q2 and Q3. In this case, when the control voltage Vc is varied, the gate-source voltage of the transistor Q3 is varied and the mutual conductance gm of the transistor Q3 is varied. The time constant during the discharging period may be controlled. In this manner, the mutual conductance gm of the transistor in the discharge path is varied to vary the time constant and control the discharge current, so that the fall time of the transfer pulse may be controlled.

Figure 18:
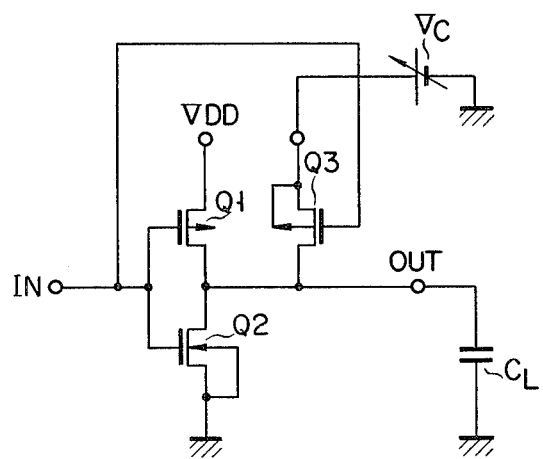

FIG. 18 shows still another embodiment of the present invention. This embodiment is basically the same as the embodiment shown in FIG. 19, but differs from it in that a control voltage is applied to the source of the MOS transistor in the charge path.

The drain of the p-type channel transistor Q3 is connected to the output terminal OUT. A control voltage Vc is applied to its source. The gate of the transistor Q3 is connected to the input terminal IN.

The mode of operation of this embodiment will now be described.

When the input pulse signal is at low level, the transistors Q1 and Q3 are on and the transistor Q2 is off. Thus, the charge current flows to the load capacitor $C_L$ through the transistors Q1 and Q3. When the control voltage Vc is varied in this case, the gate-source voltage of the transistor Q3 varies and the mutual conductance gm of the transistor Q3 varies. By changing the mutual conductance of the transistor Q3 in the charge path in this manner, the charge current, and hence the rise time of the pulse, may be controlled.

When the input pulse signal is at high level, the transistors Q1 and Q3 are off and the transistor Q2 is on. Thus, the electrons charged on the load capacitor $C_L$ are discharged through the transistor Q2.

In the embodiments shown in FIGS. 17 and 18, by varying the control voltage Vc, the mutual conductance gm of the transistor in the discharge path or the charge path is varied, and thus the fall time or the rise time is controlled.

It is also possible to provide a construction for controlling both the fall time and the rise time by combining the embodiments shown in FIGS. 17 and 18.

Figure 19:
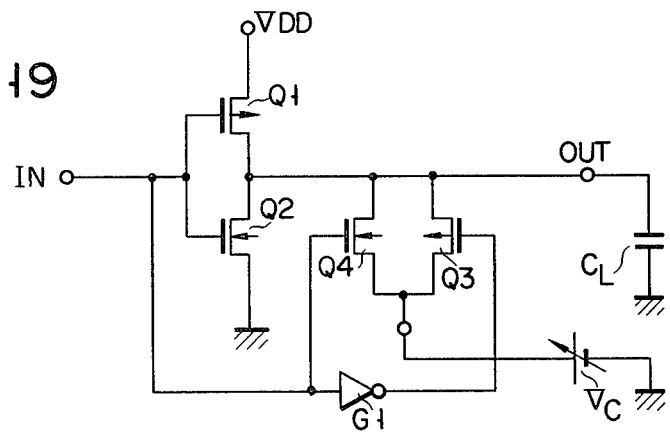

FIG. 19 shows still another embodiment of the present invention. The p-type channel transistor Q1 and the n-type channel MOS transistor Q2 constitute a CMOS inverter. The gates of the transistors Q1 and Q2 are connected to the input terminal IN. The drains of the transistors Q1 and Q2 are connected to the output terminal OUT. The drain of the p-type channel MOS transistor Q3 and the source of the MOS transistor Q4 are connected to the output terminal. A control voltage Vc is applied to the source of the transistor Q3 and to the drain of the transistor Q4. The gate of the transistor Q4 is connected to the input terminal IN. The gate of the transistor Q3 is connected to the input terminal IN through the inverter G1. The transistors Q3 and Q4 and the inverter G1 constitute an analog switch.

Describing the mode of operation of this embodiment, when the input pulse signal is at low level, the transistor Q1 is on and the transistors Q2, Q3 and Q4 are off. Thus, the charge current flows to the capacitor $C_L$ through the transistor Q1.

When the input pulse signal is at high level, the transistor Q1 is off and the transistors Q2, Q3, and Q4 are on. Thus, the electrons stored on the capacitor $C_L$ are discharged through the transistor Q2 as well as through the analog switch. In this case, the time constant is determined by the combined resistance value of the resistance of the transistor Q2 when it is on and the resistance of the analog switch when it is on, and the capacitance of the capacitor $C_L$. In this embodiment, a control voltage Vc is applied to the transistors Q3 and Q4, and a voltage potential at the output terminal OUT will not be lowered to lower than the voltage Vc. A DC level of the output pulse may be controlled by the voltage Vc.

Figure 20:
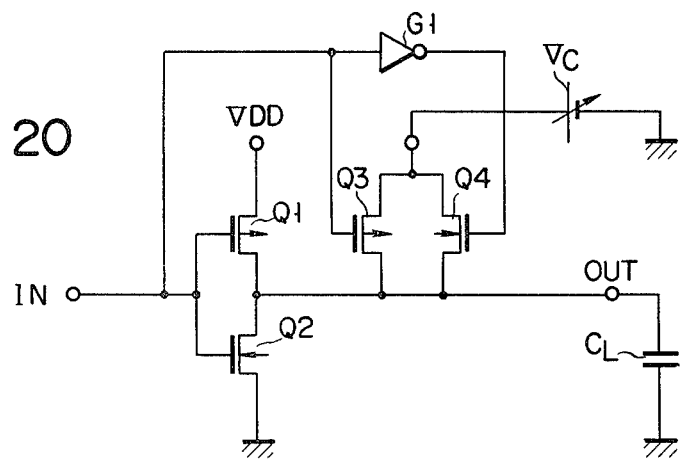

FIG. 20 shows still another embodiment of the present invention. This embodiment controls the rise time and is basically the same as the embodiment shown in FIG. 19.

In this embodiment, the gate of the transistor Q3 is connected directly to the input terminal IN, and the gate of the transistor Q4 is connected to the input terminal IN through the inverter G1.

Describing the mode of operation of this embodiment, when the input pulse signal is at low level, the transistors Q1, Q3 and Q4 are on, and the transistor Q2 is off. Thus, the charge current is the sum of the current flowing through the transistor Q1 and the current flowing through the analog switch. In this case, the time constant is determined by the combined resistance value of the resistance of the transistor Q1 when it is on and the resistance of the analog switch when it is on, and the capacitance of the capacitor $C_L$. In this embodiment, a control voltage Vc is applied to the transistors Q3 and Q4 and a voltage potential at the output terminal OUT will not be lowered to lower than control voltage Vc. A DC level of the output pulse may be controlled by the voltage Vc. Thus, the rise time may be controlled.

When the input pulse signal is at high level, the electrons charged on the capacitor $C_L$ are discharged through the transistor Q2.

According to the embodiments shown in FIGS. 19 and 20, since the analog switch is located in the discharge path or the charge path, the time constant determined by the resistance value of the analog switch when it is on and the capacitance of the capacitor $C_L$ is kept at a substantially fixed value, and a DC level of the output pulse may be controlled by the voltage Vc.

It is also possible to control both the rise time and the fall time by combining the embodiments shown in FIGS. 19 and 20.

Figure 21:
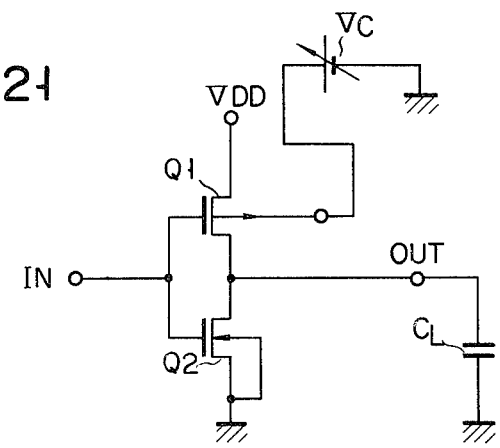

FIG. 21 shows still another embodiment of the present invention. The fall time is controlled by applying a control voltage to the substrate of the transistor in the charge path to vary the threshold voltage, and hence, the mutual conductance gm.

Referring to FIG. 21, the p-type channel MOS transistor Q1 and the n-type channel MOS transistor Q2 constitute a CMOS inverter. The gates of the transistors Q1 and Q2 are connected to the input terminal IN, and the drains of the transistors Q1 and Q2 are connected to the output terminal OUT. The source of the transistor Q1 is connected to the voltage VDD. The source and substrate of the transistor Q2 are connected to the ground.

Referring to the mode of operation of this embodiment, when the input pulse signal is at low level, the transistor Q1 is on and the transistor Q2 is off. Thus, the charge current flows to the capacitor $C_L$ through the transistor Q1. The charge current, and hence, the rise time, may be controlled by varying the control voltage Vc to vary the threshold voltage of the transistor Q1 and to vary the mutual conductance gm.

When the input pulse signal is at high level, the transistor Q1 is off and the transistor Q2 is on. Thus, the electrons charged on the load capacitor $C_L$ are discharged through the transistor Q2.

According to the embodiment shown in FIG. 21, the rise time of the output pulse may be varied by controlling the control voltage Vc to vary the threshold voltage of the transistor.

Figure 22:
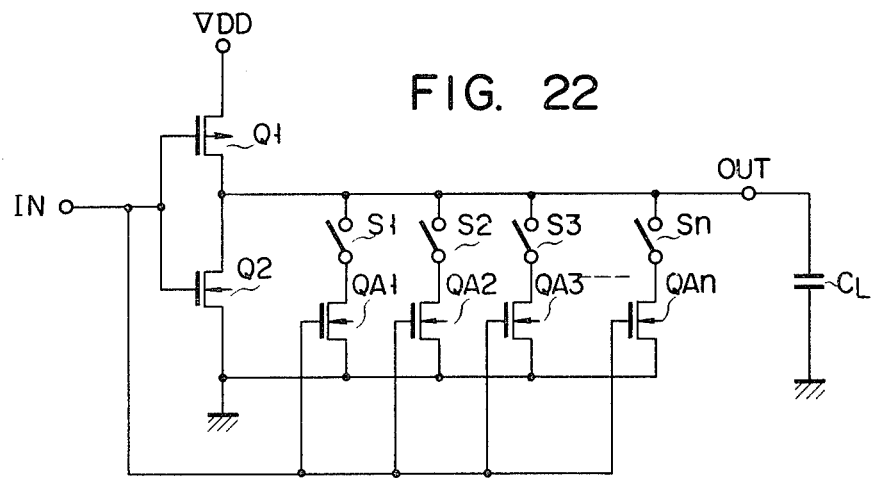

FIG. 22 shows still another embodiment of the present invention. This embodiment controls the fall time by setting the overall value of W/L of the transistor in the discharge path, thereby setting the overall mutual conductance gm.

In the embodiment shown in FIG. 22, the p-type channel MOS transistor Q1 and the n-type channel MOS transistor Q2 constitute a CMOS inverter. The gates of the transistors Q1 and Q2 are connected to the input terminal IN, and their drains are connected to the output terminal OUT. To the transistor Q2 are connected in parallel: a series circuit of an n-type channel MOS transistor QA1 and a switch S1; a series circuit of an n-type channel MOS transistor QA2 and a switch S2; ... and a series circuit of an n-type channel transistor QAn and a switch Sn. The gates of the transistors QA1, QA2, ... QAn are connected to the input terminal IN.

The mode of operation of this embodiment will now be described.

When the input pulse signal is at low level, the transistor Q1 is on, and the transistors Q2, QA1, QA2, ... QAn are off. Thus, the charge current flows to the load capacitor $C_L$ through the transistor Q1.

When the input pulse signal is at high level, the transistor Q1 is off, and the transistors Q2, QA1, QA2, ... QAn are on. Thus, the discharge current flows from the load capacitor $C_L$ to the ground through the transistor Q2, and those of the transistors QA1, QA2, ... QAn whose switches are closed. In this manner, it is possible to assemble the transistors in the discharge path which are connected in series with closed switches by selectively turning on one ore more of the switches S1, S2, ... Sn thereby enabling the value of W/L and to the fall time of the pulse to be set to desired values.

Figure 23:
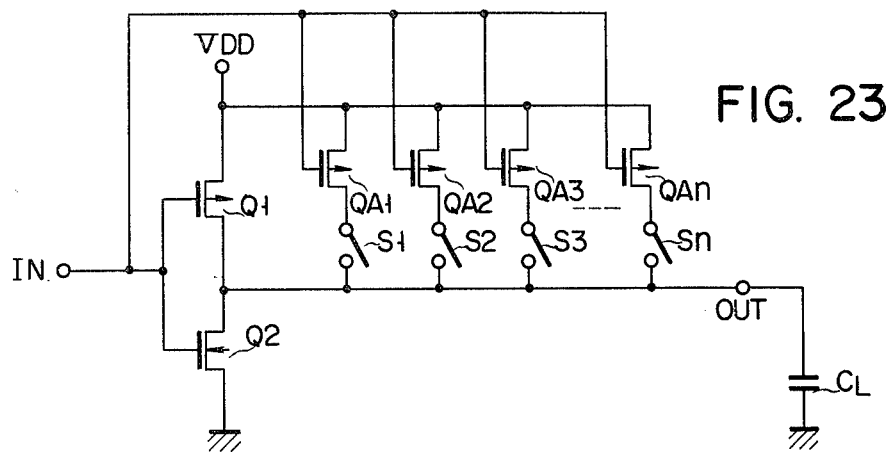

FIG. 23 shows another embodiment of the present invention.

This embodiment is basically the same as the embodiment shown in FIG. 22 and controls the overall value of W/L of the transistor in the charge path.

In this embodiment, to the transistor Q1 are connected in parallel: a series circuit of the p-type channel MOS transistor QA1 and the switch S1; a series circuit of the p-type channel MOS transistor QA2 and the switch S2; ... a series circuit of the p-type channel MOS transistor QAn and the switch Sn.

Describing the operation of this embodiment, when the input pulse signal is at low level, the transistor Q1 is on, the transistor Q2 is off, and the transistors QA1 to QAn are on. Thus, the charge current flows to the load capacitor $C_L$ through the transistor Q1 and the transistors QA1, QA2, ... QAn. It is possible to assemble the transistors in the charge path connected to switches closed by selectively turning on one or more of the switches S1, S2, ... Sn. The value of W/L may thus be controlled, and the rise time of the pulse may be set to a desired value.

When the input pulse signal is at high level, the transistor Q1 is off, the transistor Q2 is on, and the transistors QA1, QA2, ... QAn are off. Thus, the electrons charged on the load capacitor $C_L$ are discharged through the transistor Q2.

According to the embodiments shown in FIGS. 22 and 23, the overall value of the transistor may be varied, and the rise time and the fall time of the pulse may be controlled thereby. The transistors which are connected in series with the switches may be formed into ICs (integrated circuits). When forming them into ICs, it is possible to connect the contacts so that the required switches on the IC chip may be turned on.

It is also possible to control both the fall time and the rise time by adopting a construction combining the embodiment shown in FIG. 22 with the embodiment shown in FIG. 23.

Figure 24:
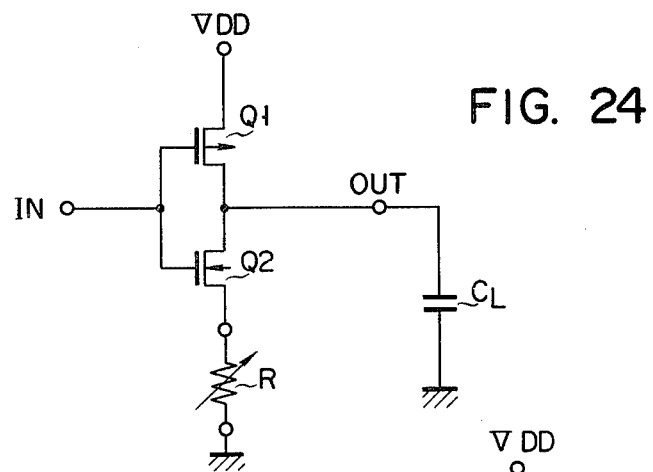

FIG. 24 shows still another embodiment of the present invention.

In this embodiment, a resistor is inserted in the discharge path to vary the time constant during the discharging period so that the rise time of the pulse may be controlled.

The p-type channel MOS transistor Q1 and the n-type channel MOS transistor Q2 constitute a CMOS inverter. The source of the transistor Q2 is grounded through a variable resistor R. The gates of the transistors Q1 and Q2 are connected to the input terminal IN. The drains of the transistors Q1 and Q2 are connected to the output terminal OUT.

Describing the mode of operation of this embodiment, when the input pulse signal is at low level, the transistor Q1 is on, and the transistor Q2 is off. Thus, the charge current flows to the load capacitor $C_L$ through the transistor Q1.

When the input pulse signal is at high level, the transistor Q1 is off, and the transistor Q2 is on. Thus, the electrons charged on the load capacitor $C_L$ are discharged through the transistor Q2 and the resistor R. The time constant $Ro \cdot C_L$ may be controlled by controlling the variable resistor R. Ro is the combined resistance value of the resistance of the transistor Q2 when it is on and the resistance of the resistor R.

Figure 25:
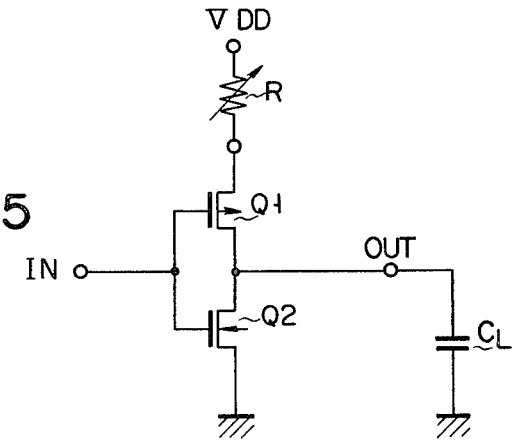

FIG. 25 shows still another embodiment of the present invention. This embodiment is basically the same as the embodiment shown in FIG. 24, but differs from it in that a resistor is inserted in the charge path to control the rise time of the pulse.

In the embodiment shown in FIG. 25, the source of the transistor Q1 is connected to the voltage VDD through the variable resistor R.

Describing the operation of this embodiment, when the input pulse voltage is at low level, the transistor Q1 is on and the transistor Q2 is off. Thus, the charge current flows to the load capacitor $C_L$ through the resistor R and the transistor Q1. The time constant $Ro \cdot C_L$ of the charge path may be controlled by controlling the variable resistor R. Ro is the combined resistance value of the resistance of the resistor R and the resistance of the transistor Q1 when it is on.

When the input pulse signal is at high level, the transistor Q1 is off, the transistor Q2 is on, and the electrons charged on the load capacitor $C_L$ are discharged through the transistor Q2.

According to the embodiments shown in FIGS. 24 and 25, the time constant, hence, the fall time and the rise time, may be controlled by controlling the variable resistor inserted in the discharge path or the charge path.

It is also possible to control both the fall time and the rise time by combining the embodiments shown in FIGS. 24 and 25.

Figure 26:
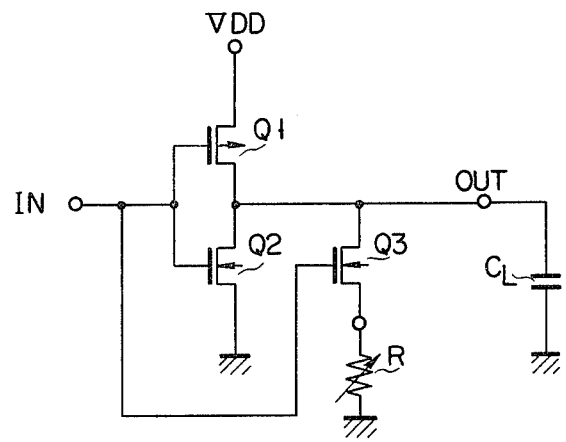

FIG. 26 shows still another embodiment of the present invention. In this embodiment, a series circuit of the n-type channel MOS transistor Q3 and the variable resistor R is connected to the n-type channel MOS transistor Q2. The fall time is controlled in this embodiment.

The p-type channel MOS transistor Q1 and the n-type channel MOS transistor Q2 constitute a CMOS inverter. The gates of the transistors Q1 and Q2 are connected to the input terminal IN, and their drains are connected to the output terminal. A series circuit of the n-type channel MOS transistor Q3 and the variable resistor R is connected in parallel with the transistor Q2.

Describing the mode of operation of this embodiment, when the input pulse signal is at low level, the transistor Q1 is on, the transistors Q2 and Q3 are off, and the charge current flows to the load capacitor $C_L$ through the transistor Q1.

When the input pulse signal is at high level, the transistor Q1 is off, and the transistors Q2 and Q3 are on. Thus, the electrons charged on the load capacitor $C_L$ are discharged through the transistor Q2 as well as through the series circuit of the transistor Q3 and the resistor R. In this manner, the fall time may be controlled by controlling the resistor R.

Figure 27:
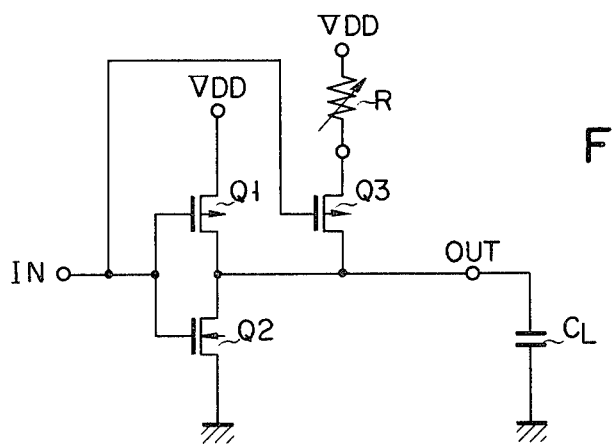

The embodiment shown in FIG. 27 is basically the same as the embodiment shown in FIG. 26 but differs from it in that the series circuit of the resistor and the transistor is connected in parallel with the charge path.

In this embodiment, a series circuit of the p-type channel MOS transistor Q3 and the variable resistor R is connected in parallel with the transistor Q1.

Describing the mode of operation of this embodiment, when the input pulse signal is at low level, the transistors Q1 and Q3 are on, and the transistor Q2 is off. Thus, the charge current is the sum of the current flowing to the load capacitor $C_L$ through the transistor Q1 and the current flowing to the load capacitor $C_L$ through the transistor Q3 and the variable resistor R. The rise time may be controlled by controlling the resistor R.

When the input pulse signal is at high level, the electrons charged on the load capacitor $C_L$ are discharged through the transistor Q2.

According to the FIGS. 26 and 27, the time constant of the charge path or the discharge path, and hence the rise time or the fall time of the transfer pulse, may be controlled by selectively controlling the resistor inserted in the charge path or the discharge path.

Although the fall time was controlled in the embodiment shown in FIG. 26 and the rise time was controlled in the embodiment shown in FIG. 27, it is possible to control both the fall time and the rise time by combining these embodiments.

Figure 28:
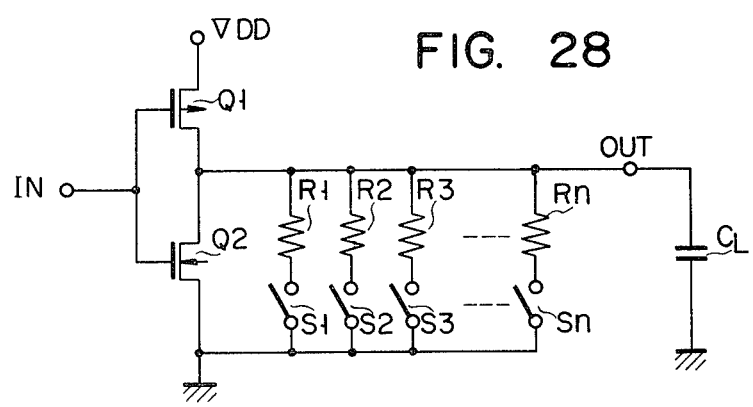

FIG. 28 shows still another embodiment of the present invention.

In this embodiment, the fall time is controlled, and series circuits consisting of resistors and switches are connected in parallel with the discharge path.

The p-type channel MOS transistor Q1 and the n-type channel MOS transistor Q2 constitute a CMOS inverter. The gates of the transistors Q1 and Q2 are connected to the input terminal IN. The drains of the transistors Q1 and Q2 are connected to the output terminal OUT. To the transistor Q2 are connected in parallel a series circuit of a resistor R1 and a switch S1, a series circuit of a resistor R2 and a switch S2, ... a series circuit of a resistor Rn and a switch Sn.

Describing the mode of operation of this embodiment, when the input pulse signal is at low level, the transistor Q1 is on, and the transistor Q2 is off. Thus, the charge current flows to the load capacitor $C_L$ through the transistor Q1.

When the input pulse signal is at high level, the transistor Q1 is off and the transistor Q2 is on. The discharge current flows from the capacitor $C_L$ through the transistor Q2 and the resistors of those series circuits in which the switches are closed. In this case, the time constant of the discharge path, and hence the fall time, may be controlled by selecting the switches to be closed.

Figure 29:
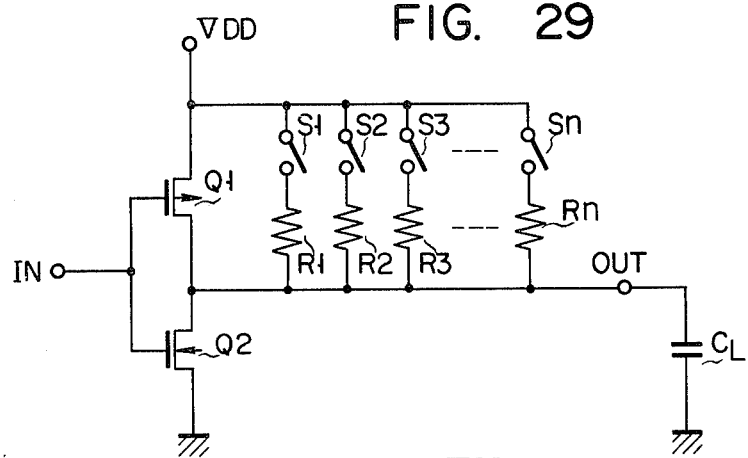

FIG. 29 shows still another embodiment of the present invention. The embodiment shown in FIG. 29 is basically the same as the embodiment shown in FIG. 28, but differs from it in that series circuits of resistors and switches are assembled in the charge path. The circuit of FIG. 29 is a circuit for controlling the rise time.

In the circuit shown in FIG. 29, to the transistor Q1 are connected in parallel a series circuit of the resistor R1 and the switch S1, a series circuit of the resistor R2 and the switch S2, ... a series circuit of the resistor Rn and the switch Sn.

Describing the mode of operation of this embodiment, when the input pulse signal is at low level, the transistor Q1 is on and the transistor Q2 is off. Thus, the charge current flows to the load capacitor $C_L$ through the transistor Q1 and the switches of the series circuits in which these switches are closed. The time constant of the charge path may be set by selecting the switches to be closed, so that the rise time of the pulse may be controlled thereby.

When the input pulse signal is at high level, the transistor Q1 is off and the transistor Q2 is on. Thus, the electrons charged on the capacitor $C_L$ are discharged through the transistor Q2.

According to the embodiments shown in FIGS. 28 and 29, the time constant of the discharge path or the charge path may be set by suitably selecting the switches to be closed. Thus, the fall time or rise time of the pulse may be controlled. The current flowing through the respective resistors may be made smaller by assembling a plurality of resistors in the path, and a concentration of generated heat may thus be prevented.

It is also possible to control both the rise time and the fall time by combining the embodiments shown in FIGS. 28 and 29.

Figure 30:
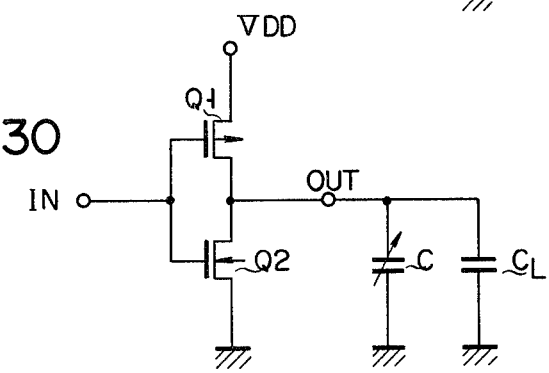

FIG. 30 shows still another embodiment of the present invention. In this embodiment, the time constant during the discharging period is varied by a variable capacitor so as to control the fall time.

The p-type channel MOS transistor Q1 and the n-type channel MOS transistor Q2 constitute a CMOS inverter. The gates of the transistors Q1 and Q2 are connected to the input terminal IN and the drains of the transistors Q1 and Q2 are connected to the output terminal OUT. A variable capacitor C is included one end of which is connected to the output terminal and the other end of which is grounded.

Describing the mode of operation of this embodiment, when the input pulse signal is at low level, the transistor Q1 is on and the transistor Q2 is off. Thus, the charge current flows to the capacitor C and the load capacitor $C_L$ through the transistor Q1.

When the input pulse signal is at high level, the transistor Q1 is off and the transistor Q2 is on. Thus, the charge stored in the capacitor C and the load capacitor $C_L$ are discharged through the transistor Q2. The time constant during the discharging period may be varied by controlling the capacitor C. Thus, the fall time is controlled.

Figure 31:
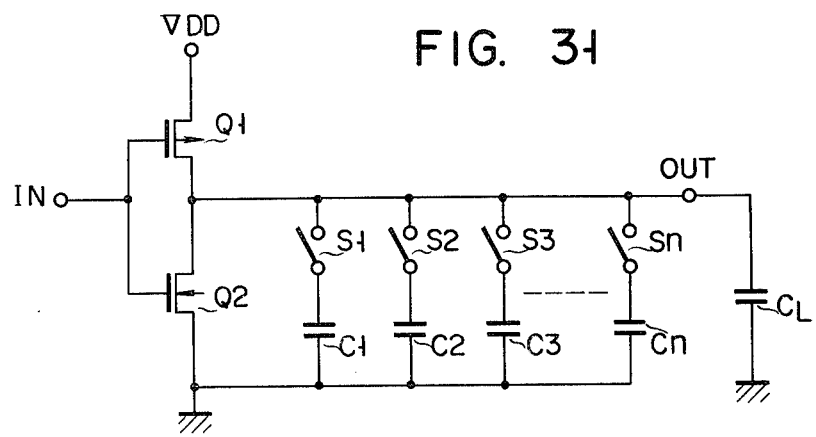

FIG. 31 shows still another embodiment of the present invention.

In this embodiment, series circuits of capacitors and switches are connected in parallel with one of the transistor of the inverter, and the capacitors are selectively assembled in the circuit so that the time constant, and hence the fall time of the pulse, may be controlled.

The p-type channel MOS transistor Q1 and the n-type channel MOS transistor Q2 constitute a CMOS inverter. The gates of the transistors Q1 and Q2 are connected to the input terminal IN. The drains of the transistors Q1 and Q2 are connected to the output terminal OUT. To the transistor Q2 are connected in parallel: a series circuit of the switch S1 and a capacitor C1, a series circuit of the switch S2 and a capacitor C2, ... and a series circuit of the switch Sn and a capacitor Cn.

Describing the mode of operation of this embodiment, when the input pulse signal is at low level, the transistor Q1 is on and the transistor Q2 is off. Thus, the charge current flows through the transistor Q1 to the capacitors of the series circuits in which the switches are closed. In this manner, the capacitors to be assembled in the discharge path are selected by selecting the switches to close. The time constant during the discharging period may thus be set to a desired value, and the fall time may be controlled thereby.

When the input pulse signal is at high level, the transistor Q1 is off and the transistor Q2 is on. The charge stored on the capacitor $C_L$ and on the capacitors of the series circuits in which the switches are closed is discharged through the transistor Q2.

According to the embodiment of FIG. 31 as described above, a plurality of capacitors may be selectively assembled in the discharge path so that the time constant may be widely varied and a time constant of suitable value may be obtained regardless of the capacitance of the capacitor $C_L$. A desired fall time may thus be obtained.

Figure 32A:
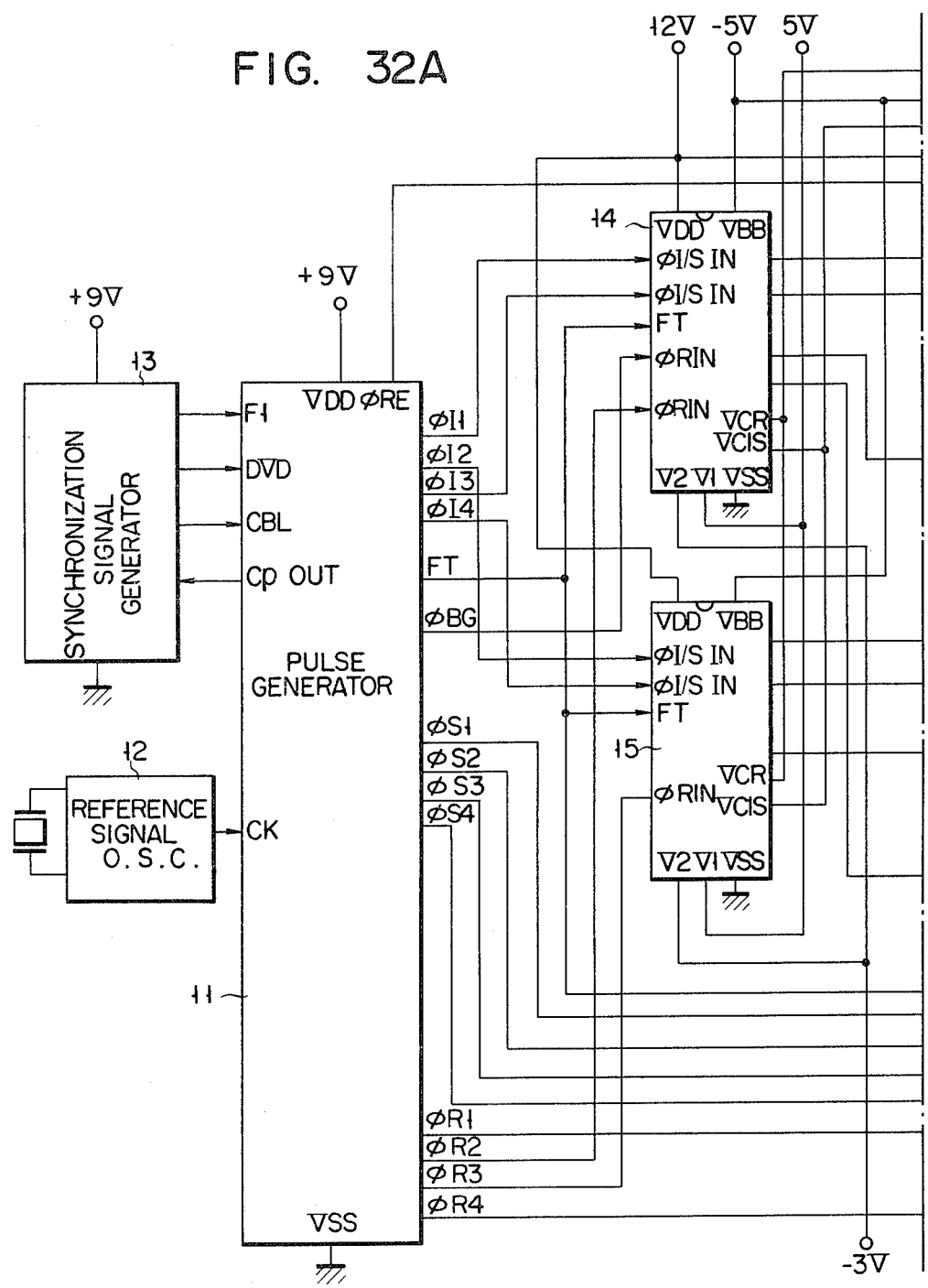
FIGS. 32A and 32B are views of the driver circuit of the present invention as applied to a camera system.
Figure 32B:
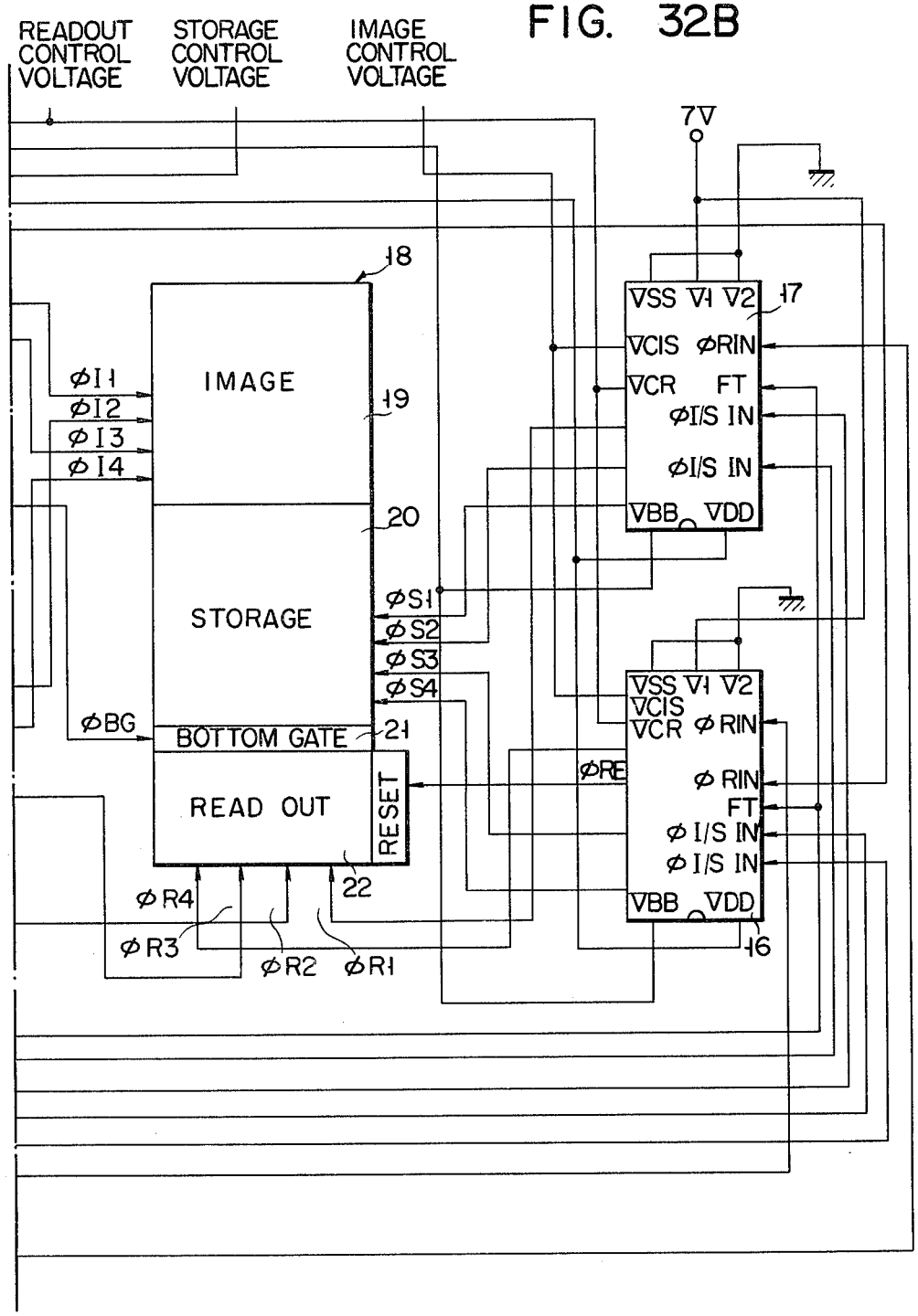

FIGS. 32A and 32B show the system construction of a camera in which are assembled the driver circuits shown in FIGS. 3 to 8 or FIGS. 11 to 31.

Referring to FIGS. 32A and 32B, numeral 11 denotes a pulse generator. To the pulse generator 11 are inputted a reference frequency signal from a crystal oscillator 12 (reference signal oscillator) and various synchronization signals from a synchronization signal generator 13. The pulse generator 11 outputs various timing signals to driver circuits 14, 15, 16 and 17 of the embodiments described above. The driver circuits 14, 15, 16 and 17 output transfer signals φI1, φI2, φI3, φI4; φS1, φS2, φS3, φS4; and φR1, φR2, φR3, φR4 to a solid state image pickup device 18. The image pickup device 18 is a frame transfer system CCD and comprises an image section 19, a storage section 20, a bottom gate section 21 and a readout section 22.

The charge generated by exposure at the image section 19 is transferred to the storage section 20 by transfer pulses φI1, φI2, φI3 and φI4 outputted from the driver circuits 14 and 15, and is stored therein. The charge stored in the storage section 20 is transferred through the bottom gate section 21 to the readout section 22 by transfer pulses φS1, φS2, φS3 and φS4 outputted from the driver circuits 16 and 17. The bottom gate section 21 is controlled by a gate control pulse φBG outputted from the driver circuit 14. The charge transferred to the readout section 22 is read out by transfer pulses φR1, φR2, φR3 and φR4 outputted from the driver circuits 14, 15, 16 and 17.

In the system as shown in FIGS. 32A and 32B, it becomes possible to transfer the charge at high efficiency in the transfer system 18 comprising a CCD by assembling the driver circuits 14, 15, 16 and 17 according to FIGS. 3 to 8 or 11 to 31.

FIGS. 32A and 32B only shows one example of an application of the driver circuit of the present invention. It is thus to be understood that the same effects may be obtained when the present invention is applied to various other systems.

What we claim is:

1. A control circuit for a charge coupled device (CCD) comprising:
    CMOS inverter means including first and second complementary MOS transistor means connected so as to respond complementarily to an input switching signal;
    means connecting said CCD to be driven by said CMOS inverter means such that said CMOS inverter provides a charge control path, including said first MOS transistor means, for the equivalent load capacitance of said CCD, said charge control path being switchable under control of said input switching signal; and
    control means including variable voltage supply means for controlling the mutual conductance of said first MOS transistor means to adjust the time constant of said charge control path.

2. The control circuit of claim 1 in which said charge control path controls the charging of said load capacitance.

3. The control circuit of claim 1 in which said charge control path controls the discharging of said load capacitance.

4. The control circuit of claim 1 wherein said control means changes the gate voltage of said first MOS transistor means on a continuous curve to enable continuous adjustment of the mutual conductance of said first MOS transistor means.

5. The control circuit according to claim 1 wherein said first MOS transistor means includes parallel-connected MOS transistors, and said control means operates to apply a variable gate voltage to at least one of said MOS transistors to change the mutual conductance thereof.

6. The control circuit of claim 5 wherein said charge control path further includes analog switch means controlled by said input switching signal to connect a variable voltage control signal to the gate of said at least one of said MOS transistors.

7. The control circuit of claim 1 wherein said first MOS transistor means includes parallel-connected MOS transistors, and said control means operates to apply a continuously variable voltage to the source of at least one of said MOS transistors to adjust the mutual conductance thereof.

8. The control circuit of claim 1 wherein said first MOS transistor means includes analog switch means connected to variable voltage supply means, said analog switch means being controlled by said input switching signal, whereby said control means both controls the mutual conductance of said first MOS transistor means and establishes the charge level of said load capacitance.

9. The control circuit of claim 1 wherein said first MOS transistor means includes at least one MOS transistor connected so that said control means operates to change the substrate voltage of said at least one MOS transistor on a continuous curve to change the mutual conductance thereof on a continuous curve.

10. The control circuit of claim 1 wherein said first MOS transistor means includes a plurality of parallel-connected MOS transistors each series-connected to a switch element, and said control means selectively controls said switch elements to selectively connect said MOS transistors in parallel so that the cumulative value of the channel width-to-length ratio of said MOS transistors is changed to control the cumulative mutual conductance of said first MOS transistor means.

11. A control circuit for a charge coupled device (CCD) comprising:
   CMOS inverter means including first and second complementary MOS transistor means connected so as to respond complementarily to an input switching signal;
   means connecting said CCD to be driven by said CMOS inverter means such that said CMOS inverter provides a charge control path, including said first MOS transistor means, for the equivalent load capacitance of said CCD, said charge control path being switchable under control of said input switching signal; and
   control means including variable capacitance means connected in parallel with said first MOS transistor means for controlling the capacitance and the time constant of said charge control path.

12. The control circuit of claim 11 wherein said variable capacitance means includes a plurality of parallel-connected capacitors each having an analog switch in series therewith, said control means further including means for selectively operating said analog switches to vary the capacitance and time constant of said charge control path.

13. A control circuit for a charge coupled device (CCD) comprising:
   CMOS inverter means including first and second complementary MOS transistor means connected so as to respond complementarily to an input switching signal;
   means connecting said CCD to be driven by said CMOS inverter means such that said CMOS inverter provides a charge control path, including said first MOS transistor means, for the equivalent load capacitance of said CCD, said control path being switchable under control of said input switching signal; and
   control means including a plurality of parallel-connected MOS transistors connected in parallel with said first MOS transistor means and further including gate control circuits for selectively biasing one or more of said parallel-connected MOS transistors into conduction to adjust the time constant of said charge control path.

14. A control circuit for a charge coupled device (CCD) comprising:
   CMOS inverter means including first and second complementary MOS transistor means connected so as to respond complementarily to an input switching signal;
   means connecting said CCD to be driven by said CMOS inverter means such that said CMOS inverter provides a charge control path, including said first MOS transistor means, for the equivalent load capacitance of said CCD, said charge control path being switchable under control of said input switching signal; and
   control means including a current path separate from the signal path of said input switching signal, said control means connected to said charge control path for changing the time constant of said charge control path in accordance with a continuous curve function in order to adjust the waveform by which the charge level of said load capacitance is varied.

* * * * *